(12) United States Patent
Osawa et al.

(10) Patent No.: US 10,624,212 B2
(45) Date of Patent: Apr. 14, 2020

(54) ELECTRONIC DEVICE

(71) Applicant: Japan Display Inc., Tokyo (JP)

(72) Inventors: Shuichi Osawa, Tokyo (JP);
Yoshikatsu Imazeki, Tokyo (JP);
Yoichi Kamijo, Tokyo (JP); Yoshihiro Watanabe, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/518,206

(22) Filed: Jul. 22, 2019

(65) Prior Publication Data

US 2019/0342997 A1 Nov. 7, 2019

Related U.S. Application Data

(63) Continuation of application No. 15/661,921, filed on Jul. 27, 2017, now Pat. No. 10,405,428.

(30) Foreign Application Priority Data

Jul. 29, 2016 (JP) .................................. 2016-149609

(51) Int. Cl.
*H05K 1/14* (2006.01)
*H05K 1/11* (2006.01)
(Continued)

(52) U.S. Cl.
CPC ........... *H05K 1/144* (2013.01); *G02F 1/1339* (2013.01); *H05K 1/115* (2013.01); *H05K 3/002* (2013.01); *H05K 3/0026* (2013.01); *H05K 3/366* (2013.01); *H05K 3/4038* (2013.01); *G02F 1/13306* (2013.01); *G02F 1/13338* (2013.01);
(Continued)

(58) Field of Classification Search
CPC ........ H05K 1/144; H05K 1/115; H05K 3/366; H05K 3/0026; H05K 3/4038; H05K 3/002; G02F 1/1339; G02F 1/136227; G02F 1/13306; G02F 1/133305; G02F 1/13338; G02F 2001/133388
See application file for complete search history.

(56) References Cited

U.S. PATENT DOCUMENTS 6,571,467 B2 6/2003 Haze et al.
8,510,936 B2 8/2013 Chuang et al.
(Continued)

FOREIGN PATENT DOCUMENTS

JP 2002-40465 A 2/2002
JP 2010232249 A 10/2010
WO 2017094457 A1 6/2017

*Primary Examiner* — Nathan Milakovich
(74) *Attorney, Agent, or Firm* — K&L Gates LLP

(57) ABSTRACT

An electronic device is provided and including a first substrate including a first glass substrate and a first conductive layer; a second substrate including: a second glass substrate which is disposed to be apart from the first conductive layer and includes a first surface opposed to the first conductive layer and a second surface opposite to the first surface, a second conductive layer disposed on the second surface, and a first hole penetrating the second glass substrate; and a connecting material electrically connecting the first conductive layer and the second conductive layer via the first hole, wherein the first hole is shaped as a funnel, and the connecting material includes a hollow part in which an insulative filling material is filled.

20 Claims, 12 Drawing Sheets

(51) Int. Cl.
  *H05K 3/00*       (2006.01)
  *H05K 3/40*       (2006.01)
  *H05K 3/36*       (2006.01)
  *G02F 1/1339*     (2006.01)
  *G02F 1/1333*         (2006.01)
  *G02F 1/133*          (2006.01)
  *G02F 1/1362*         (2006.01)

(52) U.S. Cl.
  CPC .. *G02F 1/133305* (2013.01); *G02F 1/136227* (2013.01); *G02F 2001/133388* (2013.01); *H05K 2201/041* (2013.01); *H05K 2201/09036* (2013.01); *H05K 2201/09827* (2013.01); *H05K 2201/10136* (2013.01); *H05K 2203/107* (2013.01)

(56) References Cited

U.S. PATENT DOCUMENTS

| | | | |
|---|---|---|---|
| 9,232,652 | B2 | 1/2016 | Fushie et al. |
| 9,722,301 | B2 * | 8/2017 | Kim .................. H05K 5/0217 |
| 10,034,374 | B2 * | 7/2018 | Koide ............... G02F 1/133345 |
| 10,061,170 | B2 | 8/2018 | Osawa et al. |
| 10,268,299 | B2 | 4/2019 | Watanabe et al. |
| 2006/0289203 | A1 * | 12/2006 | Oda ..................... H01L 21/486 174/264 |
| 2007/0058099 | A1 * | 3/2007 | Eguchi .............. G02F 1/136227 349/43 |
| 2013/0026653 | A1 * | 1/2013 | Yamamichi ......... H01L 23/5384 257/774 |
| 2016/0135289 | A1 | 5/2016 | Cho et al. |
| 2016/0322291 | A1 | 11/2016 | Goers |
| 2017/0077045 | A1 | 3/2017 | Liu et al. |
| 2017/0147104 | A1 | 5/2017 | Imazeki |
| 2017/0295652 | A1 | 10/2017 | Isobe |
| 2018/0031932 | A1 | 2/2018 | Koide |
| 2018/0031934 | A1 | 2/2018 | Watanabe et al. |
| 2018/0031938 | A1 | 2/2018 | Watanabe et al. |
| 2018/0031939 | A1 | 2/2018 | Imazeki |
| 2018/0032175 | A1 | 2/2018 | Imazeki |
| 2018/0032192 | A1 | 2/2018 | Watanabe et al. |
| 2018/0032194 | A1 | 2/2018 | Koide |
| 2018/0032204 | A1 | 2/2018 | Imazeki |
| 2018/0033617 | A1 * | 2/2018 | Imazeki ................ G02F 1/1345 |
| 2018/0033800 | A1 * | 2/2018 | Koide ............... G02F 1/133514 |
| 2018/0033801 | A1 * | 2/2018 | Koide .................. H01L 27/124 |
| 2018/0033969 | A1 | 2/2018 | Kamijo et al. |
| 2018/0035541 | A1 | 2/2018 | Kamijo et al. |
| 2018/0210262 | A1 * | 7/2018 | Osawa .................. G02F 1/1345 |
| 2018/0212550 | A1 | 7/2018 | Imazeki et al. |
| 2018/0213638 | A1 | 7/2018 | Osawa et al. |
| 2018/0284924 | A1 * | 10/2018 | Watanabe ............. G06F 3/0416 |
| 2018/0335869 | A1 * | 11/2018 | Watanabe .............. G06F 3/044 |
| 2019/0042028 | A1 | 2/2019 | Imazeki |

* cited by examiner

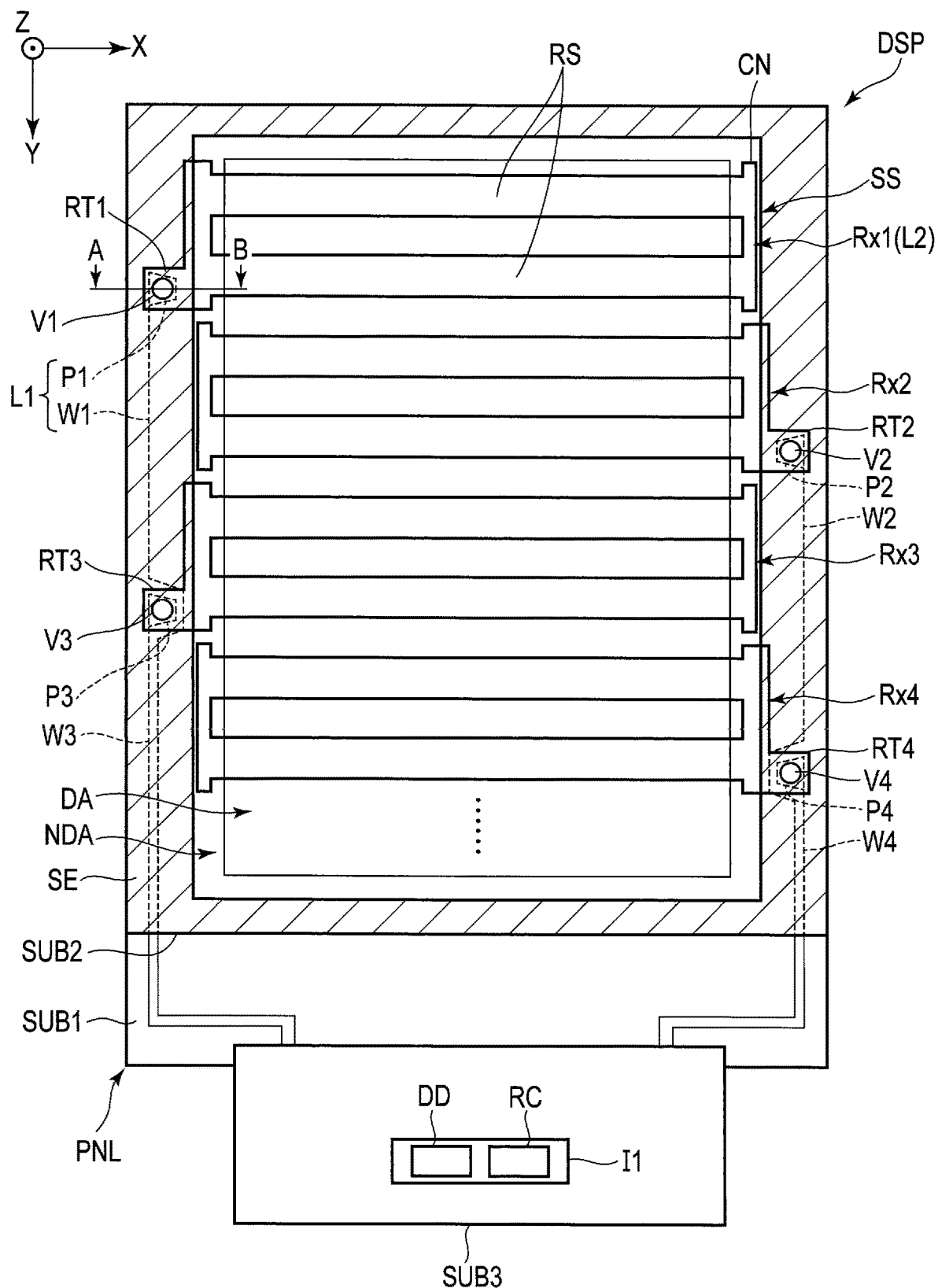
F I G. 1

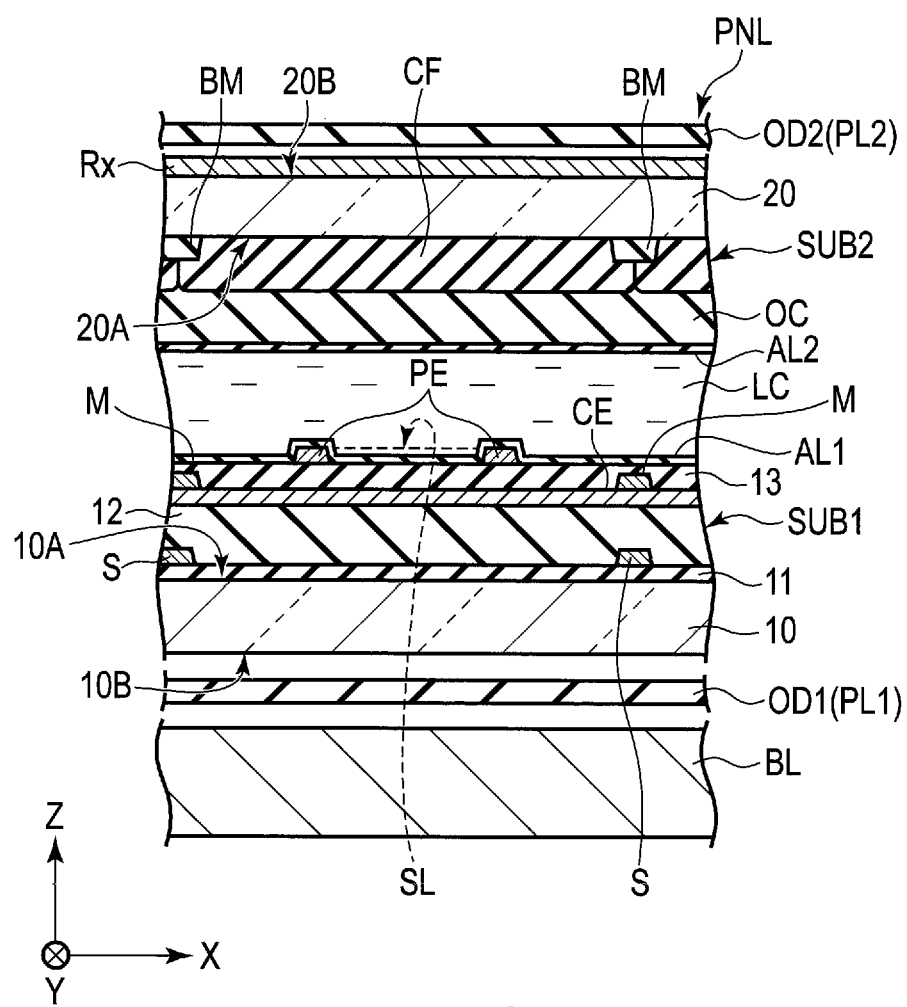
F I G. 3

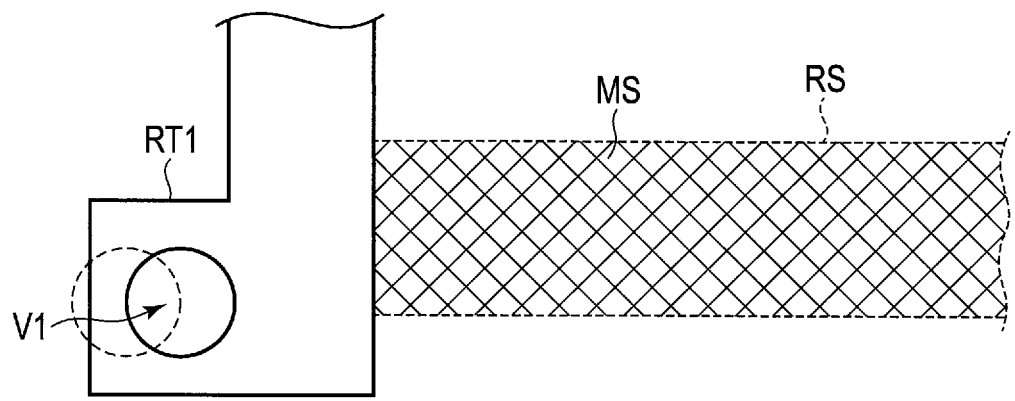
F I G. 5A
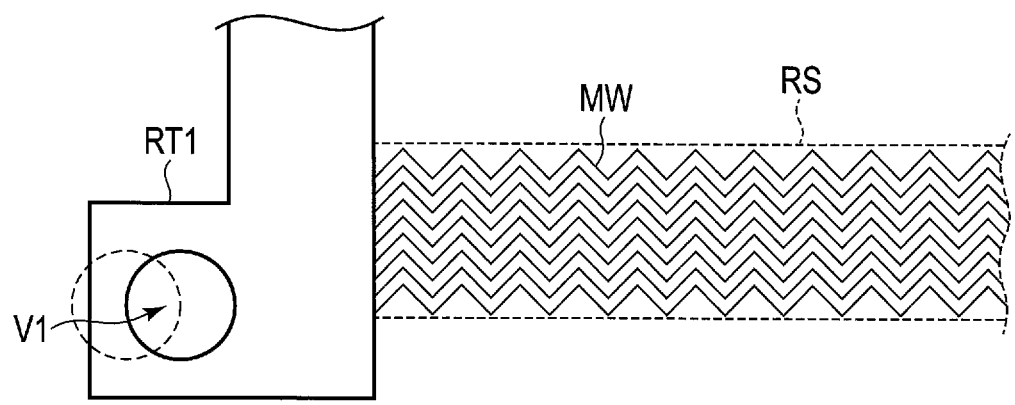
F I G. 5B

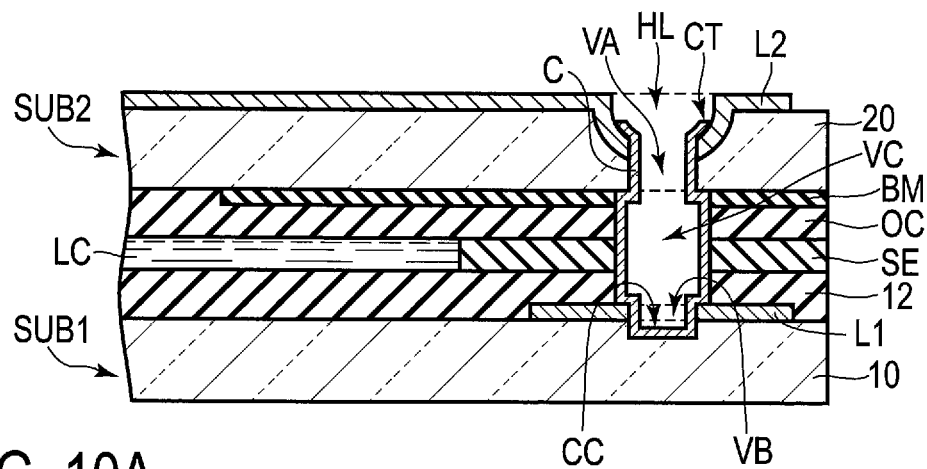
F I G. 10A
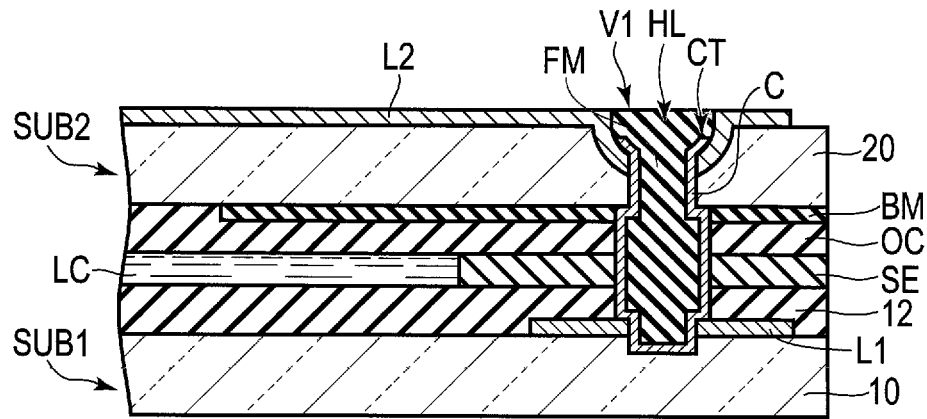
F I G. 10B
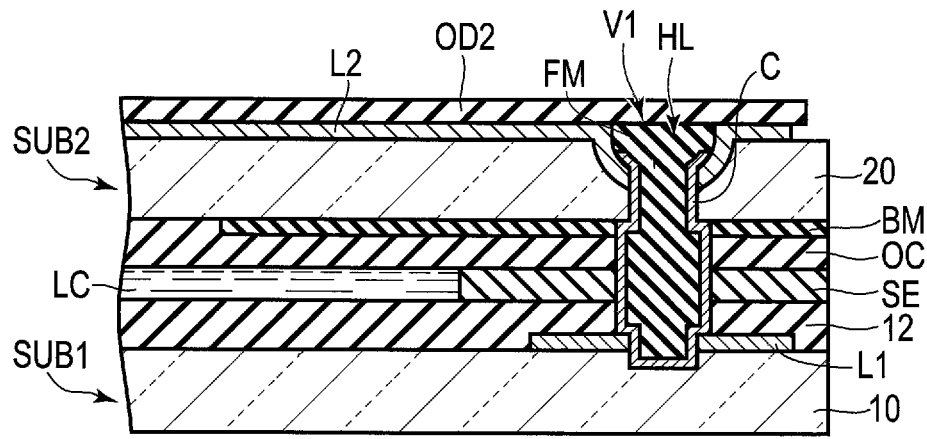
F I G. 10C

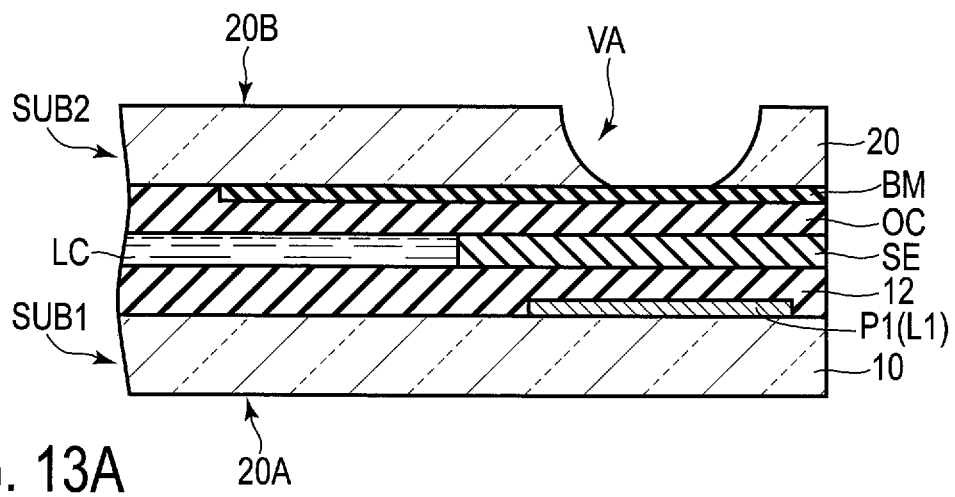
F I G. 13A
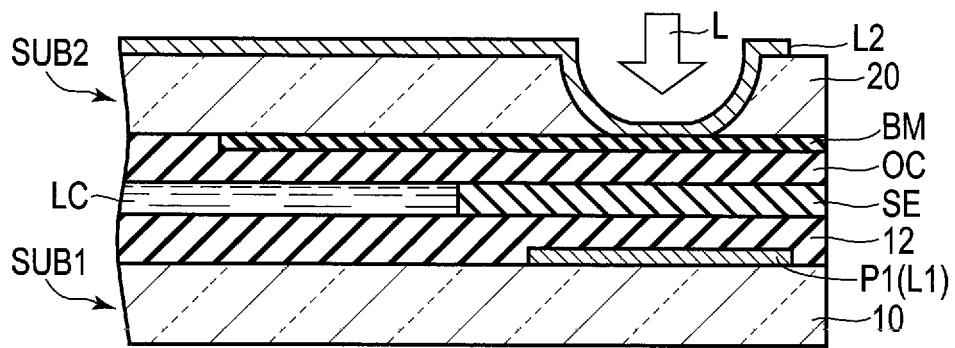
F I G. 13B
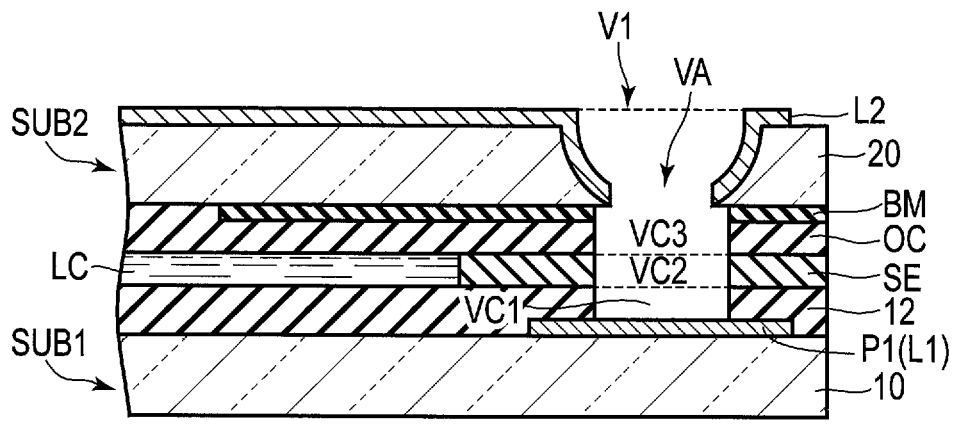
F I G. 13C

ELECTRONIC DEVICE

CROSS-REFERENCE TO RELATED APPLICATIONS

This application is a continuation of U.S. patent application Ser. No. 15/661,921, filed on Jul. 27, 2017, which is based upon and claims the benefit of priority from Japanese Patent Application No. 2016-149609, filed Jul. 29, 2016, the entire contents of which are incorporated herein by reference.

FIELD

Embodiments described herein relate generally to an electronic device and a manufacturing method of an electronic device.

BACKGROUND

In recent years, various technique to achieve a thin bezel structure of display devices have been studied. For example, there is a structure in which a intersubstrate connector electrically connects a line part including an inner hole connector inside a hole penetrating an inner surface and an outer surface of a resin first substrate and a line part disposed in an inner surface of a resin second substrate.

SUMMARY

The present disclosure generally relates to an electronic device and a manufacturing method of an electronic device.

In an embodiment, an electronic device is provided. The electronic device includes a first substrate including a first basement and a first conductive layer; a second substrate including a second basement which is disposed to be apart from the first conductive layer and includes a first surface opposed to the first conductive layer and a second surface opposite to the first surface, a second conductive layer disposed on the second surface, a first hole penetrating the second basement; and a connecting material electrically connecting the first conductive layer and the second conductive layer via the first hole, wherein the first hole is shaped as a funnel.

In another embodiment, an electronic device is provided. The electronic device includes a first substrate including a first basement and a first conductive layer; a second substrate including a second basement which is disposed to be apart from the first conductive layer and includes a first surface opposed to the first conductive layer and a second surface opposite to the first surface, a second conductive layer disposed on the second surface, a first hole penetrating the second basement; and a connecting material electrically connecting the first conductive layer and the second conductive layer via the first hole, wherein the first hole is formed in a bowl-like shape, and a width of the first hole along the second surface is greater than a width of the first hole along the first surface.

In a further embodiment, a manufacturing method of an electronic device is provided. The method includes preparing a first substrate including a first basement and a first conductive layer and a second substrate including a second basement which is apart from the first conductive layer; forming a concavity in the second basement at a second surface which is opposite to a first surface which is opposed to the first substrate; etching the first basement and the second basement to decrease the thickness thereof and to expand the concavity; forming a second conductive layer on the second surface of the second basement and inside the concavity; irradiating an area where the concavity is formed with a laser light to form a hole penetrating at least the second conductive layer in the concavity and the second basement; and forming a connecting material electrically connecting the first conductive layer and the second conductive layer via the hole.

Additional features and advantages are described herein, and will be apparent from the following Detailed Description and the figures.

BRIEF DESCRIPTION OF THE DRAWINGS

FIG. 1 is a schematic plan view of a display device of a first embodiment.

FIG. 3 is a schematic cross-sectional view of a display area of the display device of FIG. 1.

FIG. 5A shows a detection electrode of the display device of FIG. 1 in an enlarged manner.

FIG. 5B shows another example of the detection electrode of the display device of FIG. 1 in an enlarged manner.

FIG. 10A is a schematic cross-sectional view showing a manufacturing process after FIG. 9C.

FIG. 10B is a schematic cross-sectional view showing a manufacturing process after FIG. 10A.

FIG. 10C is a schematic cross-sectional view showing a manufacturing process after FIG. 10B.

FIG. 13A is a schematic cross-sectional view showing a manufacturing process of the display device of the second embodiment.

FIG. 13B is a schematic cross-sectional view showing a manufacturing process after FIG. 13A.

FIG. 13C is a schematic cross-sectional view showing a manufacturing process after FIG. 13B.

DETAILED DESCRIPTION

Figure 2:
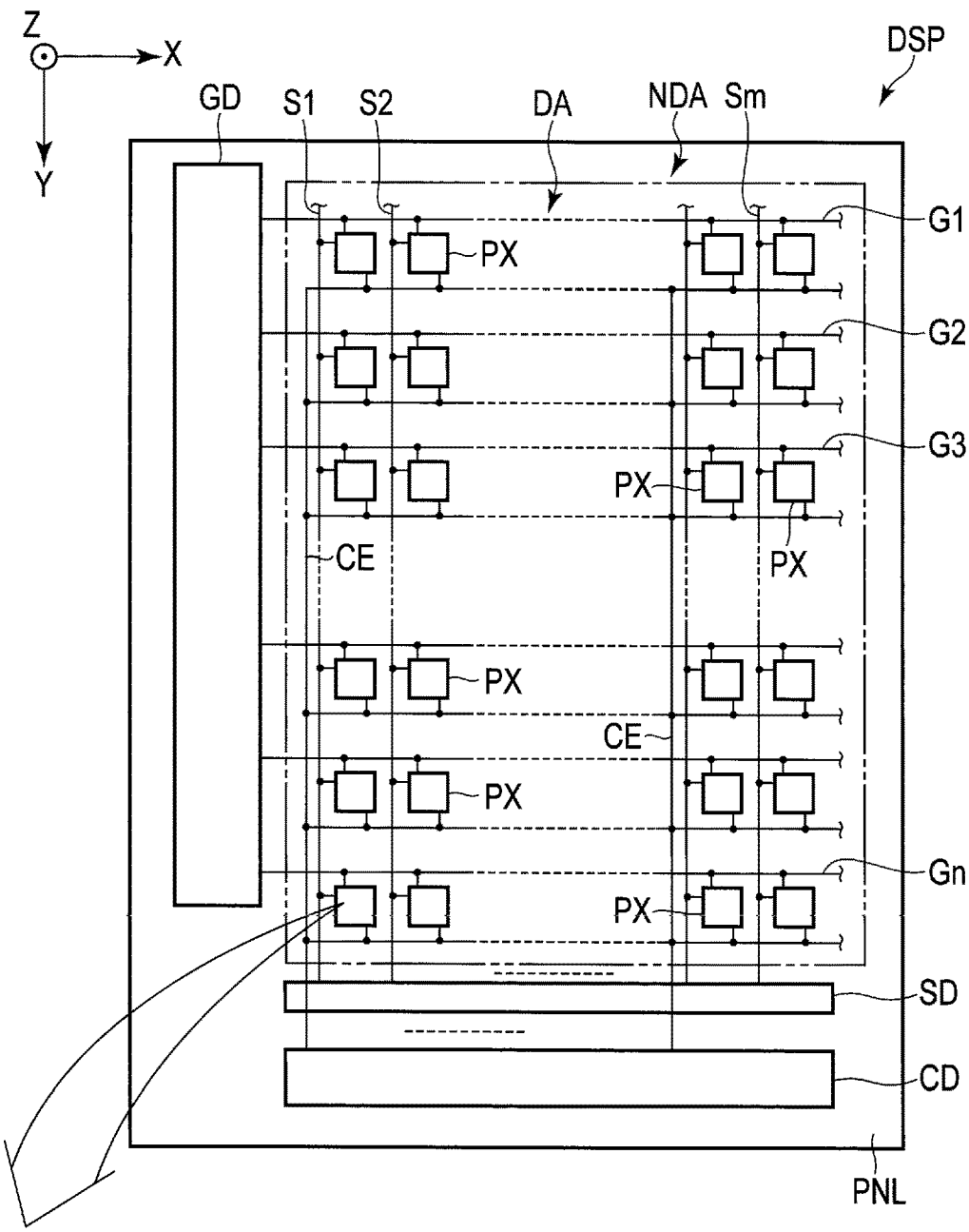
FIG. 2 is an equivalent circuit of the display device of FIG. 1.
Figure 2:
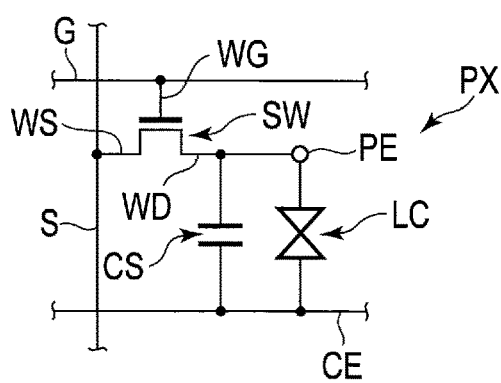

In general, according to one embodiment, an electronic device includes: a first substrate including a first basement and a first conductive layer; a second substrate including a second basement which is disposed to be apart from the first conductive layer and includes a first surface opposed to the first conductive layer and a second surface opposite to the first surface, and a second conductive layer disposed on the second surface, the second substrate including a first hole penetrating the second basement; and a connecting material electrically connecting the first conductive layer and the second conductive layer via the first hole, wherein the first hole is shaped as a funnel.

According to one embodiment, an electronic device includes: a first substrate including a first basement and a first conductive layer; a second substrate including a second basement which is disposed to be apart from the first conductive layer and includes a first surface opposed to the first conductive layer and a second surface opposite to the first surface, and a second conductive layer disposed on the second surface, the second substrate including a first hole penetrating the second basement; and a connecting material electrically connecting the first conductive layer and the second conductive layer via the first hole, wherein the first hole is formed in a bowl-like shape and a width of the first hole along the second surface is greater than a width of the first hole along the first surface.

According to one embodiment, a manufacturing method of an electronic device, the method includes: preparing a first substrate including a first basement and a first conductive layer and a second substrate including a second basement which is apart from the first conductive layer; forming a concavity in the second basement at a second surface which is opposite to a first surface which is opposed to the first substrate; etching the first basement and the second basement to decrease the thickness thereof and to expand the concavity; forming a second conductive layer on the second surface of the second basement and inside the concavity; irradiating laser in the area where the concavity is formed to form a hole penetrating at least the second conductive layer in the concavity and the second basement; and forming a connecting material electrically connecting the first conductive layer and the second conductive layer via the hole.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

First Embodiment

In the present embodiment, a display device will be described as an example of the electronic device. The display devices of the present embodiment can be used in various devices such as smartphones, tablets, feature phones, personal computers such as clamshell computers, and gaming devices. Structures described in the present embodiment can be applied to liquid crystal display devices, self-luminescent display devices such as an organic electroluminescent display device, electronic paper display devices with electrophoretic elements, micro electro mechanical system (MEMS)-applied display devices, and electrochromism-applied display devices.

FIG. 1 is a plan view showing an example of the structure of a display device DSP of a first embodiment. Here, the display device DSP is exemplified as a liquid crystal display device including a sensor SS. A first direction X, second direction Y, and third direction Z are orthogonal to each other; however, the first direction X and the second direction Y may cross at an angle other than 90 degrees. The first direction X and the second direction Y are parallel to the surface (surface) of the display device DSP, and the third direction Z corresponds to a thickness direction of the display device DSP. Here, a flat surface of a part of the display device DSP on X-Y plane defined by the first direction X and the second direction Y is shown. In the following description, the third direction Z will be defined as above (or up) and the opposite direction to the third direction Z will be defined as below (or down). Furthermore, viewing against the third direction Z will be referred to as plan view.

The display device DSP includes, for example, a display panel PNL, IC chip I1, and wiring substrate SUB3.

The display panel PNL is a liquid crystal display panel including a first substrate SUB1, second substrate SUB2, sealant SE, and display function layer (liquid crystal layer LC which will be described later). The first substrate SUB1 and the second substrate SUB2 are opposed to each other in the third direction Z. In the example depicted, the second substrate SUB2 is disposed above the first substrate SUB1. The sealant SE is disposed in the part hatched diagonally upward in FIG. 1 to adhere the first substrate SUB1 and the second substrate SUB2. The display function layer is held between the first substrate SUB1 and the second substrate SUB2.

The display panel PNL includes a display area DA and a non-display area NDA. The display area DA is an area for image display and is surrounded by the sealant SE. The non-display area NDA surrounds the display area DA. The sealant SE is disposed in the non-display area NDA.

The wiring substrate SUB3 is mounted on the first substrate SUB1. The wiring substrate SUB3 is, for example, a flexible substrate. Note that, the flexible substrate applied to the present embodiment is a flexible substrate at least partly formed of a flexible material. For example, the wiring substrate SUB3 of the present embodiment may be a flexible substrate entirely structured as a flexible part or may be a rigid flexible substrate including a rigid part which is formed of a hard material such as glass epoxy and a flexible part which is formed of a flexible material such as polyimide.

The IC chip I1 is mounted on the wiring substrate SUB3. Note that, other than the example depicted, the IC chip I1 may be mounted on the first substrate SUB1 extending outside than is the second substrate SUB2, or may be mounted on an outer wiring substrate connected to the wiring substrate SUB3. The IC chip I1 includes, for example, a display driver DD which outputs signals necessary for image display. The display driver DD includes, as will be described later, at least a part of each of a signal line driver SD, scanning line driver GD, and a common electrode driver CD. Furthermore, in the example depicted, the IC chip I1 includes a detection circuit RC which functions as a touch panel controller. Note that the detection circuit RC may be stored in a different IC chip than the IC chip I1.

The display panel PNL may be a transmissive liquid crystal display device which displays an image by selectively passing the light from the lower side of the first substrate SUB1 (opposite side to the display surface), or may be a reflective liquid crystal display device which displays an image by selectively reflecting the external light from the upper side of the second substrate SUB2 (display surface side), or may be a transflective liquid crystal display device having both the transmissive function and the reflective function.

A sensor SS mounted in the display device DSP is used for sensing an object contacting or approaching the display device DSP. The sensor SS includes a plurality of detection electrodes Rx (Rx1, Rx2 . . . ). The detection electrodes Rx are provided with the second substrate SUB2. The detection electrodes Rx extend in the first direction X and are arranged in the second direction Y at intervals. In FIG. 1, detection electrodes Rx1 to Rx4 are depicted as the detection electrodes Rx, and the structure of detection electrodes Rx will be explained with reference to the detection electrode Rx1.

That is, the detection electrode Rx1 includes a detector RS, terminal RT1, and connector CN.

The detector RS is disposed in the display area DA and extends along the first direction X. In the detection electrode Rx1, the detector RS is used for sensing. In the example depicted, the detector RS has a band-like shape, and as will be described later with reference to FIG. 5, the detector RS is an aggregation of micro metal fragments. Furthermore, one detection electrode Rx1 includes two detectors RS; however, it may include three or more detectors RS or may include a single detector RS.

The terminal RT1 is disposed in one end of the non-display area NDA along the first direction X and is connected to the detector RS. The connector CN is disposed in the other end of the non-display area NDA along the first direction X and connects a plurality of detections parts RS. In FIG. 1, one end is in the left of the display area DA and the other end is in the right of the display area DA. A part of the terminal RT1 is formed in a position overlapping the sealant SE in a plan view.

On the other hand, the first substrate SUB1 includes a pad P1 and a line W1. The pad P1 and the line W1 are disposed in one end of the non-display area NDA and overlap the sealant SE in a plan view. The pad P1 is formed in a position overlapping the terminal RT1 in a plan view. The line W1 is connected to the pad P1, extends along the second direction Y, and is electrically connected to the detection circuit RC of the IC chip I1 via the wiring substrate SUB3.

In the present embodiment, the pad P1 and the line W1 are referred to as a first conductive layer L1, and detection electrodes Rx are referred to as a second conductive layer L2. The display panel PNL includes a contact hole V1 for connection of the first conductive layer L1 and the second conductive layer L2.

The contact hole V1 is disposed in a position where the terminal RT1 and the pad P1 are opposed to each other. Furthermore, the contact hole V1 penetrates the second substrate SUB2 including the terminal RT1 and the sealant SE, and may penetrate the pad P1. In the example depicted, the contact hole V1 is a circle in a plan view; however, the shape thereof is not limited to the example depicted, and may be a different shape such as an ellipse. A connecting material is provided in the contact hole 1 for the electrical connection of the terminal RT1 and the pad P1. Thus, the detection electrode Rx1 in the second substrate SUB2 is electrically connected to the detection circuit RC via the wiring substrate SUB3 connected to the first substrate SUB1. The detection circuit RC reads a sensor signal output from the detection electrodes Rx to detect contact or approach of an object and coordinates of such an object.

In the example depicted, odd-number terminals RT1, RT3 . . . of respective odd-number detection electrodes Rx1, Rx3 . . . , odd-number pads P1, P3 . . . , odd-number lines W1, W3 . . . , and odd-number contact holes V1, V3 . . . are disposed in one end of the non-display area NDA. Furthermore, even-number terminals RT2, RT4 . . . of respective even number detection electrodes Rx2, Rx4 . . . , even-number pads P2, P4 . . . , even-number lines W2, W4 . . . , and even-number contact holes V2, V4 . . . are disposed in the other end of the non-display area NDA. In such a layout, the width of the one end in the non-display area NDA and the width of the other end in the non-display area NDA can be uniformed which is effective for a thin bezel structure.

As shown, in the layout where the pad P3 is closer to the wiring substrate SUB3 than is the pad P1, the line W1 bypasses the pad P3 in an inside route (that is, bypassing the pad P3 in the side close to the display area DA) and is arranged along a line W3 between the pad P3 and the wiring substrate SUB3 wherein the line W1 is disposed inside than is the line W3. Similarly, the line W2 bypasses a pad P4 in an inside route and is arranged along a line W4 between the pad P4 and the wiring substrate SUB3 wherein the line W2 is disposed inside than is the line W4.

FIG. 2 shows the basic structure and an equivalent circuit of the display panel of FIG. 1.

The display panel PNL includes a plurality of pixels PX in the display area DA. Here, a pixel is a minimum unit which can be separately controlled with pixel signals, and for example, is disposed in an area including a switching element at a crossing point of a scanning line and a signal line as will be described later. A plurality of pixels PX are arranged in a matric in the first direction X and the second direction Y. Furthermore, the display panel PNL includes, for example, a plurality of scanning lines G (G1 to Gn), signal lines S (S1 to Sm), and common electrode CE in the display area DA. The scanning lines G each extend in the first direction X and are arranged in the second direction Y. The signal lines S each extend in the second direction Y and are arranged in the first direction X. Note that the scanning lines G and the signal lines S may not necessarily extend linearly and may be bend partly. A common electrode CE is disposed over the pixels PX. The scanning lines G, signal lines S, and common electrode CE are drawn to the non-display area NDA. In the non-display area NDA, the scanning lines G are connected to the scanning line driver GD, signal lines S are connected to the signal line driver SD, and common electrode CE is connected to the common electrode driver CD. The signal line driver SD, scanning line driver GD, and common electrode driver CD may be formed on the first substrate SUB1, or may partly or entirely stored in the IC chip I1 of FIG. 1.

Each pixel PX includes, for example, a switching element SW, pixel electrode PE, common electrode CE, and liquid crystal layer LC. The switching element SW is, for example, a thin film transistor (TFT) and is electrically connected to a scanning line G and a signal line S. Specifically, the switching element SW includes a gate electrode WG, source electrode WS, and drain electrode WD. The gate electrode WG is electrically connected to the scanning line G. In the example depicted, an electrode electrically connected to the signal line S will be referred to as source electrode WS, and an electrode electrically connected to the pixel electrode PE will be referred to as drain electrode WD.

The scanning line G is connected to the switching element SW in each of pixels PX arranged in the first direction X.

The signal line S is connected to the switching element SW in each of pixels PX arranged in the second direction Y. Each pixel electrode PE is opposed to the common electrode CE and the liquid crystal layer LC is driven with a field produced between the pixel electrodes PE and the common electrode CE. The capacitance CS is, for example, formed between the common electrode CE and the pixel electrodes PE.

FIG. 3 is a cross-sectional view of the display area DA of the display panel PNL of FIG. 1. Here, a cross-sectional view is taken along the X-Z plane which is defined by the first direction X and the third direction Z. In the following description, a direction from the first substrate SUB1 to the second substrate SUB2 will be referred to as above (or up), and a direction from the second substrate SUB2 to the first substrate SUB1 will be referred to as below (or down).

The display panel PNL depicted corresponds to a horizontal field display mode which uses a field substantially parallel to the substrate surface. Note that, the display panel PNL may correspond to a vertical field display mode which uses a field vertical to the substrate surface, or an inclined field display mode which uses a field inclined with respect to the substrate surface, or a combination of the above display modes. To the display mode using a lateral electric field, for example, such a structure is applicable, that both of the pixel electrode PE and the common electrode CE are provided one of the first substrate SUB1 and the second substrate SUB2. To the display mode using a vertical electric field or an oblique electric field, for example, such a structure is applicable, that one of the pixel electrode PE and the common electrode CE is provided on the first substrate SUB1, and the other one of the pixel electrode PE and the common electrode CE is provided on the second substrate SUB2. Note that the substrate surface is a surface parallel to the X-Y plane.

The first substrate SUB1 is formed using a first basement 10. The first basement 10 is, for example, a glass substrate. Note that the first basement 10 may be formed of an insulating material such as a resin. The first basement 10 comprises a surface 10A opposed to the second substrate SUB2 and a surface 10B opposite to the surface 10A. The first substrate SUB1 comprises, on a surface 10A side of the first basement 10, signal lines S, a common electrode CE, metal layers M, pixel electrodes PE, an insulating layer 11, another insulating layer 12, still another insulating layer 13, a first alignment film AL1, etc. Note that, in the figure, switching elements, scanning lines, and various insulating layers and the like interposed therebetween are omitted.

The first insulating layer 11 is disposed on the first basement 10. The scanning lines and the semiconductor layer of switching elements not shown in the drawing are located between the first basement 10 and the first insulating layer 11. The signal lines S are disposed on the first insulating layer 11. The second insulating layer 12 is disposed on the signal lines S and the first insulating layer 11. The common electrode CE is disposed on the second insulating layer 12. The metal layers M contact the common electrode CE immediately above the signal lines S, respectively. In the example depicted, the metal layers M are disposed on the common electrode CE; however, it may be disposed between the common electrode CE and the second insulating layer 12. The third insulating layer 13 is disposed above the common electrode CE and the metal layers M. The pixel electrodes PE are disposed above the third insulating layer 13. The pixel electrodes PE are opposed to the common electrode CE with the third insulating layer 13 interposed therebetween. Furthermore, the pixel electrodes PE have slits SL in positions opposed to the common electrode CE. The first alignment film AL1 covers the pixel electrodes PE and the third insulating layer 13.

The scanning lines G, signal lines S, and metal layers M are formed of a metal material such as molybdenum, tungsten, titanium, or aluminum, and may have a monolayer structure or multilayer structure. The common electrode CE and the pixel electrodes PE are formed of a transparent conductive material such as indium tin oxide (ITO) or indium zinc oxide (IZO). The first insulating layer 11 and the third insulating layer 13 are inorganic insulating layers, and the second insulating layer 12 is an organic insulating layer.

Note that, the structure of the first substrate SUB1 is not limited to the example depicted and the first substrate SUB1 may be structured such that the pixel electrodes PE are disposed between the second insulating layer 12 and the third insulating layer 13 and the common electrode CE is disposed between the third insulating layer 13 and the first alignment film AL1. In such a case, the pixel electrodes PE are formed in a flat plate-like shape without a slit and the common electrode CE includes slits opposed to the pixel electrodes. Furthermore, the first substrate SUB1 may be structured such that both the pixel electrodes PE and the common electrode CE are formed in a comb-like shape to engage each other.

The second substrate SUB2 is formed using a second basement 20. The second basement 20 is, as with the first basement, formed of a glass or a resin. The second basement 20 comprises a surface 20A opposed to the first substrate SUB1 and a surface 20B opposite to the surface 20A. The second substrate SUB2 comprises, on a surface 20A side of the second basement 20, light-shielding layers BM, a color filter CF, an overcoat layer OC, a second alignment film AL2, etc.

The light shielding layers BM and the color filter CF are disposed on the second basement 20 in the side opposed to the first substrate SUB1. The light shielding layers BM separate pixels and are disposed directly above the signal lines S, respectively. The color filter CF opposes the pixel electrodes PE and partly overlaps the light shielding layers BM. The color filter CF includes, for example, a red color filter, a green color filter, and a blue color filter. The overcoat layer OC covers the color filter CF. The second alignment film AL2 covers the overcoat layer OC.

Note that the color filter CF may be disposed on the first substrate SUB1. The color filter CF may include color filters of four or more colors. For a white pixel, a white color filter may be arranged, or a colorless resin material may be arranged, or a color filter may be omitted and the overcoat layer OC may be arranged.

The detection electrodes Rx are disposed on the second basement 20 at the surface 20B. As described above, the detection electrodes Rx correspond to the second conductive layer L2, and may be formed of a conductive layer containing a metal or a transparent conductive material such as ITO or IZO, or may be formed a transparent conductive layer layered on a conductive layer containing a metal, or may be formed of a conductive organic material or a dispersing element of micro conductive materials or like.

A first optical element OD1 including a first polarizer PL1 is disposed between the first basement 10 and an illumination device BL. A second optical element OD2 including a second polarizer PL2 is disposed on the detection electrodes Rx. The first optical element OD1 and the second optical element OD2 may include a retardation plate, if necessary.

Now, an example of the structure of the sensor SS mounted on the display device DSP of the present embodiment will be explained. The sensor SS described below is, for example, a mutual capacitance type sensor which detects an object contacting or approaching on the basis of a change in the capacitance between a pair of electrodes opposed to each other with a dielectric interposed therebetween.

Figure 4:
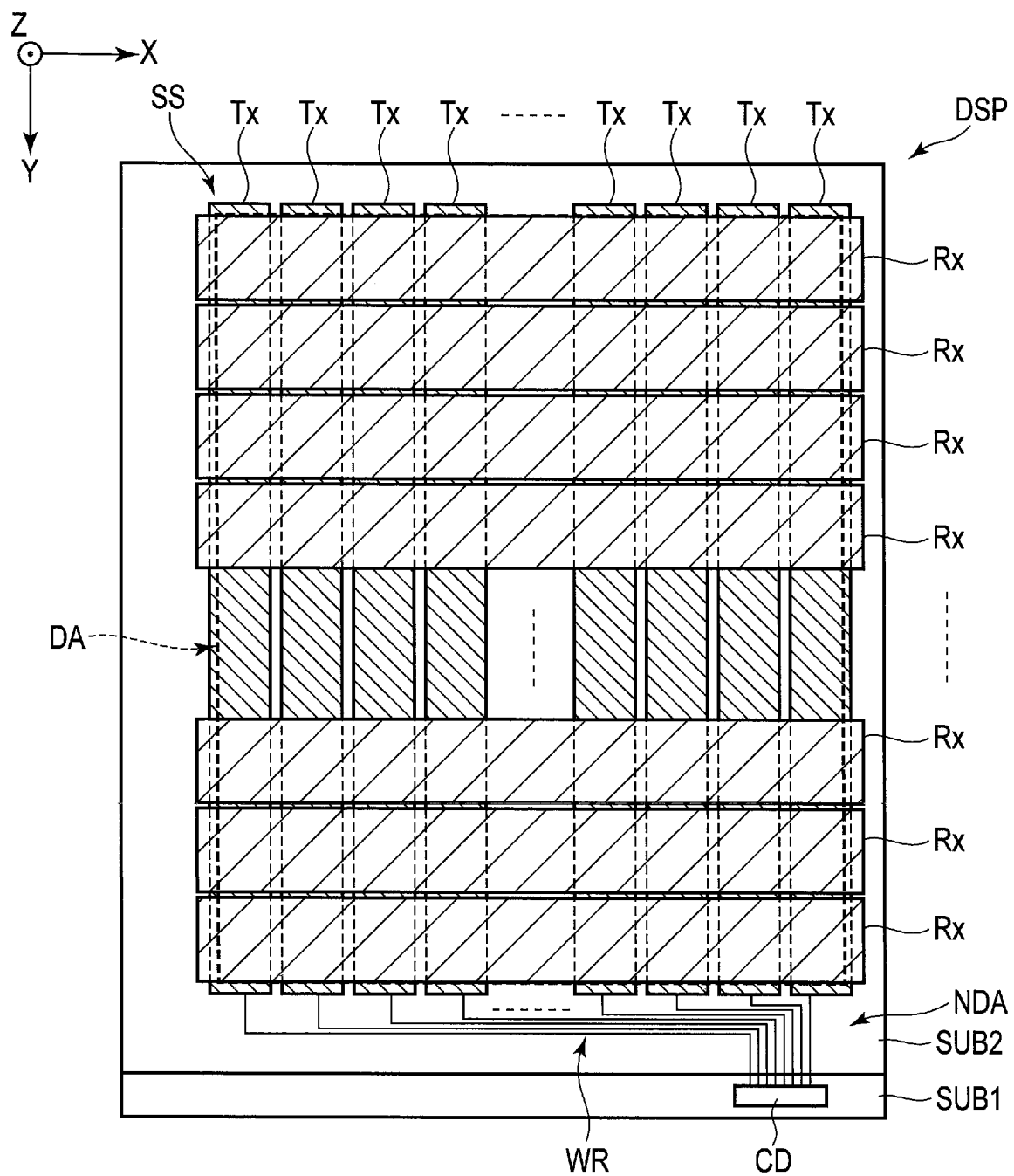
FIG. 4 is a schematic plan view of a sensor mounted on the display device of FIG. 1.

FIG. 4 is a plan view showing an example of the structure of the sensor SS.

In the example depicted, the sensor SS includes sensor drive electrodes Tx and detection electrodes Rx. In the example depicted, the sensor drive electrodes Tx correspond to the hatched diagonally downward part and are provided with the first substrate SUB1. Furthermore, the detection electrodes Rx correspond to the part hatched diagonally upward and are provided with the second substrate SUB2. The sensor drive electrodes Tx and detection electrodes Rx are orthogonal to each other in the X-Y plane. The detection electrodes Rx are opposed to the sensor drive electrodes Tx in the third direction Z.

The sensor drive electrodes Tx and detection electrodes Rx are disposed in the display area DA and partly extend in the non-display area NDA. In the example depicted, the sensor drive electrodes Tx each have a band-like shape extending in the second direction Y and are arranged in the first direction X at intervals. The detection electrodes Rx each extend in the first direction X and are arranged in the second direction Y at intervals. The detection electrodes Rx are, as described above with reference to FIG. 1, connected to pads in the first substrate SUB1 and electrically connected to the detection circuit RC via lines. The sensor drive electrodes Tx are each electrically connected to the common electrode driver CD via lines WR. Note that the number, size, and shape of the sensor drive electrodes Tx and the detection electrodes Rx are not limited specifically, and various changes can be applied thereto.

The sensor drive electrodes Tx include the above-described common electrode CE, and have a function of generating an electric field between itself and the respective pixel electrode PE and also a function of detecting the position of the object by generating the capacitance between itself and the respective detection electrode Rx.

The common electrode driver CD supplies common drive signals to the sensor drive electrodes Tx including the common electrode CE during the display drive in which an image is displayed in the display area DA. Furthermore, the common electrode driver CD supplies sensor drive signals to the sensor drive electrodes Tx during the sensing drive in which sensing is performed. The detection electrodes Rx output sensor signals required for the sensing (that is, signals based on a change in the interelectrode capacitance between the sensor drive electrodes Tx an the detection electrodes Rx) with the supply of the sensor drive signals to the sensor drive electrodes Tx. The detection signals output from the detection electrodes Rx are input in the detection circuit RC in FIG. 1.

Note that the sensor SS in the above example of the structure is not limited to a mutual capacitance type which detects an object on the basis of a change in the capacitance between a pair of electrodes (in the above example, the capacitance between the sensor drive electrodes Tx and the detection electrodes Rx), and may be a self capacitance type which detects an object on the basis of a change in capacitance of the detection electrodes Rx.

FIG. 5A and FIG. 5B show an example of the structure of the detector RS of the detection electrode Rx1 in FIG. 1.

In the example of FIG. 5A, the detector RS is formed of a mesh-like metal fragments MS. The metal fragments MS are connected to the terminal RT1. In the example of FIG. 5B, the detector RS is formed of a wave-like metal fragments MW. In the example depicted, the metal fragments MW is zigzag-shaped; however, it may be some other shape such as a sine wave shape. The metal fragments MW are connected to the terminal RT1.

The terminal RT1 is, for example, formed of the same material used for the detector RS. In the terminal RT1, a circular contact hole V1 is formed. Note that the contact hole V1 may partly overlap the terminal RT1 as depicted by a dotted-line circle.

Figure 6A:
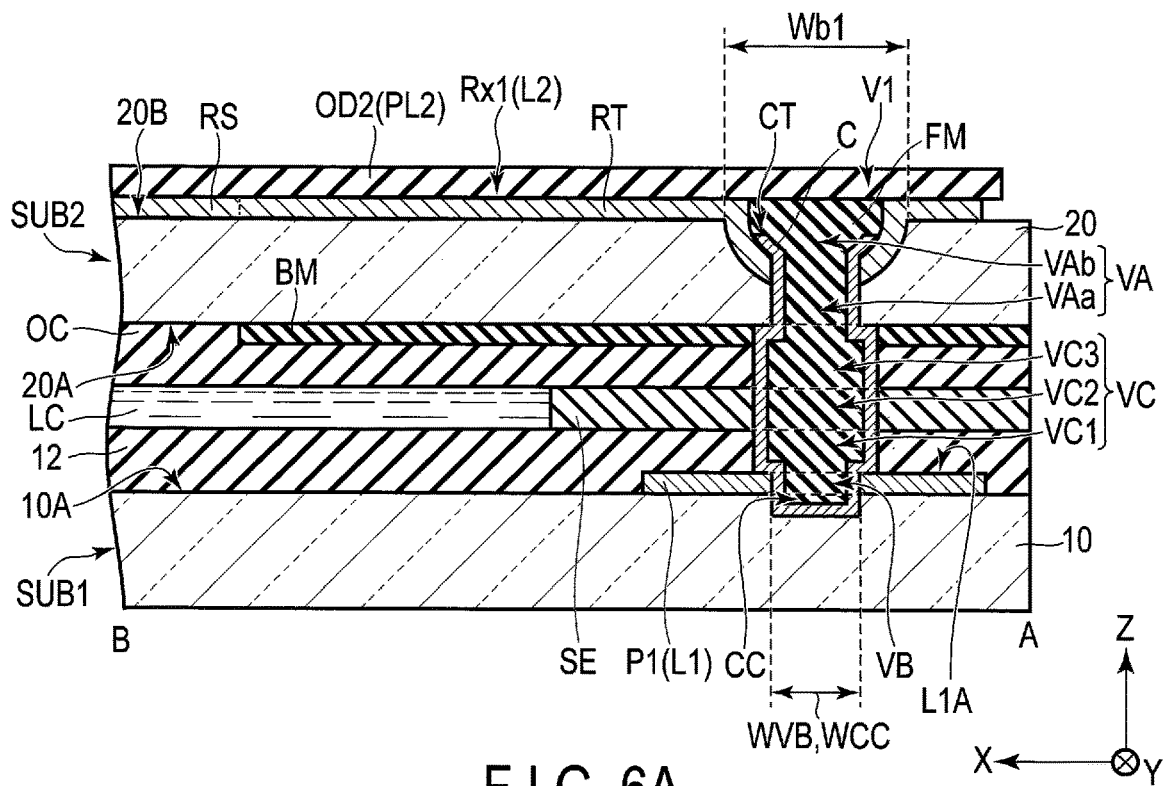
FIG. 6A is a schematic cross-sectional view of a non-display area of the display device of FIG. 1.

FIG. 6A is a cross-sectional view of the display panel PNL, taken along line A-B including the contact hole V1 of FIG. 1. Here, only the main part necessary for the explanation is shown.

The first substrate SUB1 includes, for example, the first basement 10, the pad P1 corresponding to the first conductive layer L1, and the second insulating layer 12 corresponding to an organic insulating layer. The pad P1 is, for example, formed of the same material used for the signal lines S of FIG. 3. The first insulating layer 11 shown in FIG. 3 and other insulating layers and conductive layers may be disposed between the first basement 10 and the pad P1, and between the first basement 10 and the second insulating layer 12.

The second substrate SUB2 includes, for example, the second basement 20, the detection electrode Rx1 corresponding to the second conductive layer L2, and the light shielding layer BM and overcoat layer OC corresponding to an organic insulating layer.

The sealant SE corresponds to an organic insulating layer and is disposed between the second insulating layer 12 and the overcoat layer OC. The liquid crystal layer LC is disposed in a gap between the first substrate SUB1 and the second substrate SUB2. Note that, although this is not shown, the metal layers M, third insulating layer 13, and first alignment film AL1 shown in FIG. 3 may be interposed between the second insulating layer 12 and the sealant SE. Furthermore, between the overcoat layer OC and the sealant SE, the second alignment film AL2 shown in FIG. 3 may be interposed.

The contact hole V1 includes a hole VA which penetrates the second basement 20, a hole VB which penetrates the pad P1, a hole VC which penetrates various organic insulating layer, and a concavity CC formed in the first basement 10. In the example depicted, the contact hole V1 penetrates the terminal RT of the detection electrode Rx. The concavity CC, hole VB, hole VC, and hole VA are arranged in the third direction Z in this order and positioned on the same straight line along the third direction Z.

The hole VA is formed in a funnel, for example, and includes a concavity VAb formed in the second basement 20 in its surface 20B side and a hole VAa in its surface 20A side. As will be described later, the hole VA includes a concavity side surface of which is curved and a tube-like hole extends downward from the bottom surface of the concavity.

The hole VC includes a first part VC1 which penetrates the second insulating layer 12, a second part VC2 which penetrates the sealant SE, and a third part VC3 which penetrates the light shielding layer BM and overcoat layer OC. If the first alignment film AL1 is interposed between the sealant SE and the second insulating layer 12, the first part VC1 penetrates the first alignment film AL1. If the second alignment film AL2 is interposed between the sealant SE and the overcoat layer OC, the third part VC3 penetrates the second alignment film AL2. The first part VC1, second part VC2, and third part VC3 are arranged in the third direction Z in this order. The second part VC2 is connected to the first part VC1 and the third part VC3.

A width WVB of the hole VB and a width WCC of the concavity CC is less than a width Wb1 of the concavity VAb. Here, the width WVB is taken, for example, in the upper surface L1A of the pad P1 along the first direction X. The width WCC is taken, for example, in the surface 10A along the first direction X. Furthermore, the width Wb1 is taken, for example, in the surface 20B along the first direction X. Note that, in the example depicted, the width WVB and the width WCC are equal; however, they may be different.

The terminal RT of the detection electrode Rx is provided with the surface 20B of the second basement 20 and within the concavity VAb. In the concavity VAb, the detection electrode Rx contacts a connecting material C.

The connecting material C is disposed in the contact hole V1 and electrically connects the detection electrode Rx and the pad P1 corresponding to the first conductive layer L1. In the example depicted, the connecting material C includes a hollow part in which an insulative filling material FM is filled. However, a conductive filling material may be filled therein instead. Or, the connecting material C may be filled in the contact hole V1.

An upper end (end in the second surface side) CT of the connecting material C is positioned below the surface 20B of the second basement 20 (first substrate SUB1 side).

The connecting material C overlaps the terminal RT in the concavity VAb and contacts the second basement 20 in the hole VAa. In other words, the second basement 20 contacts the terminal RT and the connecting material C in the hole VA. Furthermore, the connecting material C contacts the light shielding layer BM and the overcoat layer OC in the third part VC3 in the hole VC, contacts the sealant SE in the second part VC2, and further contacts the second insulating layer 12 in the first part VC1 of the hole VC. In the example depicted, the connecting material C contacts the upper surface L1A of the pad P1 in the first part VC1. Furthermore, the connecting material C contacts the pad P1 in the hole VB and contacts the first basement 10 in the concavity CC.

Figure 6B:
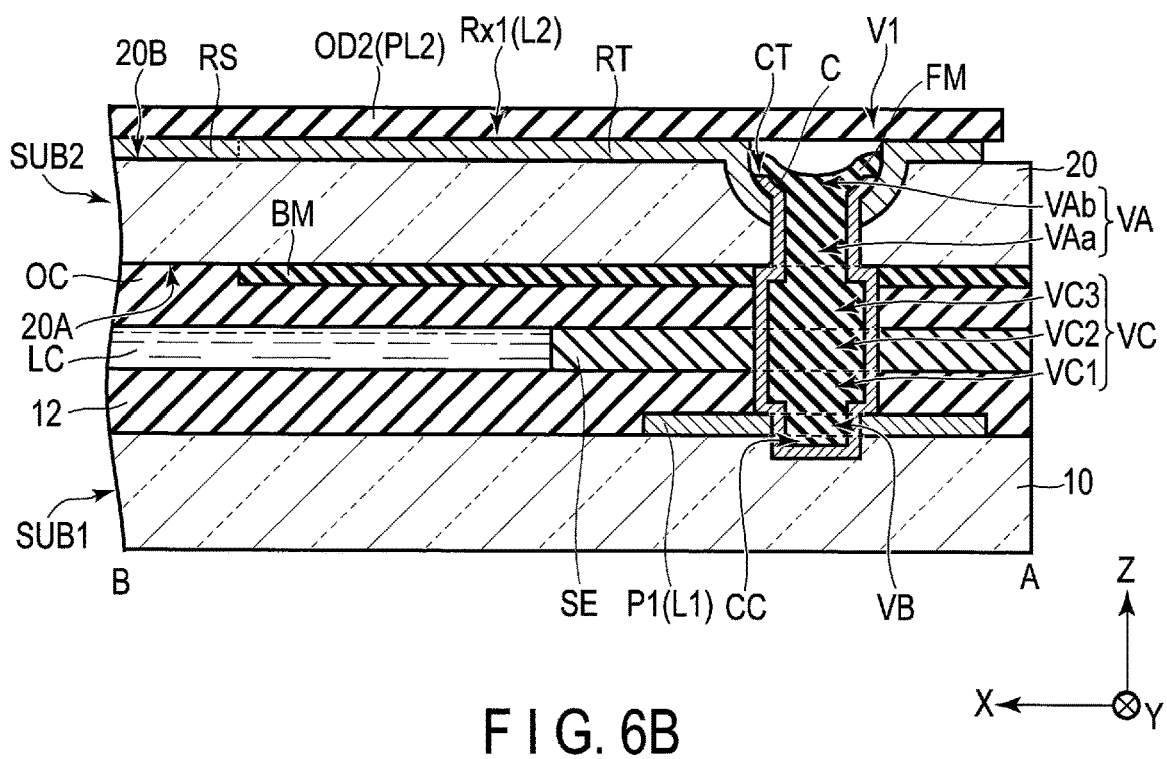
FIG. 6B is another example of schematic cross-sectional view of the non-display area of the display device of FIG. 1.

FIG. 6B shows another example of the structure of the display panel PNL, taken along line A-B including the contact hole V1 of FIG. 1.

In the example of FIG. 6B, the filling material FM do not fully fill in the concavity VAb, and in this respect, the example of FIG. 6B differs from the example of FIG. 6A. That is, the filling material FM is apart from the second optical element OD2. For example, air or the like is between the filling material FM and the second optical element OD2. Note that the filling material FM may partly contacts the second optical element OD2.

Figure 7A:
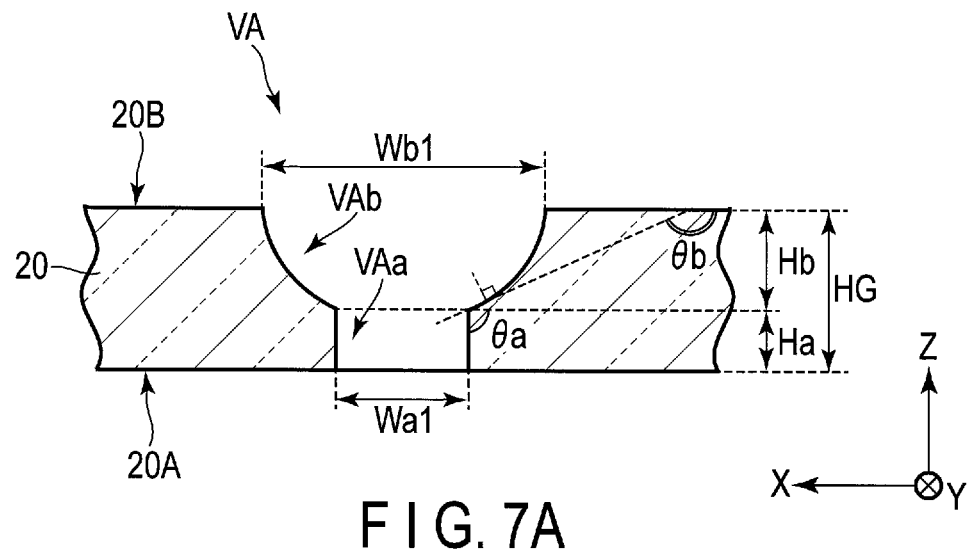
FIG. 7A shows a basement of FIG. 6 in an enlarged manner.
Figure 7B:
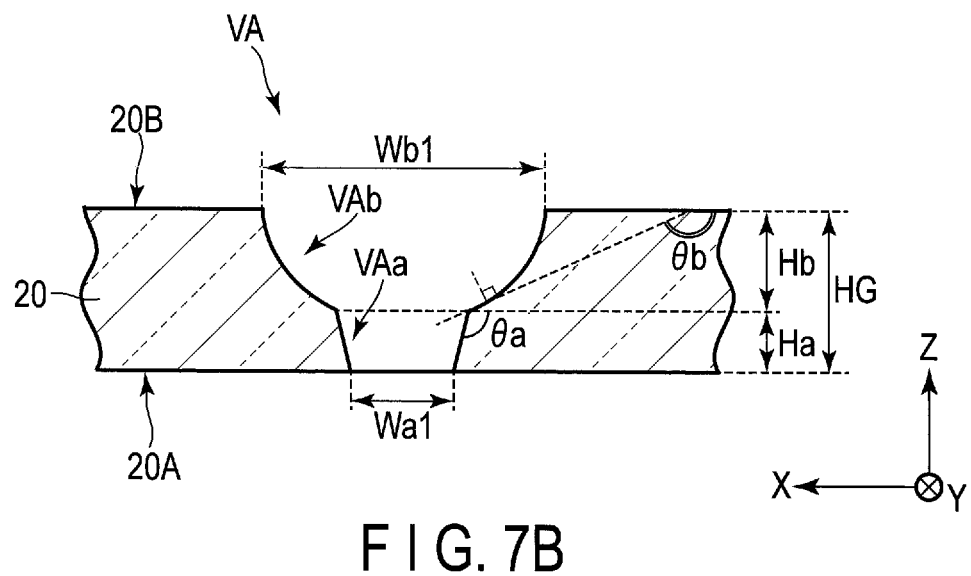
FIG. 7B shows another example of the basement of FIG. 6 in an enlarged manner.

FIG. 7A and FIG. 7B shows the hole VA which penetrates the second basement 20 in an enlarged manner. Here, the cross-section is on the X-Z plane defined by the first direction X and the third direction Z.

The concavity VAb has, for example, a bowl-like shape. That is, the side surface of the concavity VAb is curved. For example, the cross-section of the concavity VAb may have a curve the center of a curvature of which comes above the hole VAb in the third direction Z. The cross-section of the concavity VAb may have a plurality of curves. Hereinafter, an angle between a tangent of the side surface of the concavity VAb and the surface 20B of the second basement 20 (that is, surface parallel to the X-Y plane) will be defined as θb. The angle θb is, for example, 90 degrees in the proximity of the surface 20B and gradually approaches 180 degrees while reaching the surface 20A.

The hole VAa has, as shown in FIG. 7A, a tube-like shape having substantially constant width or diameter in the first direction X. That is, the side surface (inner surface) of the hole VAa basically goes along the third direction Z. Or, the hole VAa may be, as shown in FIG. 7B, formed as a circular truncated cone having a width or a diameter in the surface 20A thereof which is greater than that in the surface 20B side. In the following description, an angle between the side surface of the hole VAa and a surface parallel to the X-Y plane will be defined as θa. In the example of FIG. 7A, the angle θa is substantially 90 degrees. In the example of FIG. 7B, the angle θa is greater than 90 degrees. In each case of FIG. 7A and FIG. 7B, the angle θa are basically constant with respect to the third direction Z.

As compared to the case of the hole VAa, the diameter of the concavity AVb changes greatly in the third direction Z. Furthermore, the part of the side surface of the concavity VAb, closer to the surface 20A is greatly inclined with respect to the third direction Z as compared to the side surface of the hole VAa. In other words, the angle θb is greater than the angle θa in at least the part of the side surface of the concavity VAb, closer to the surface 20A. Specifically, in the example of FIG. 7A, the angle θa is substantially 90 degrees and thus, θb≥θa in any part of the side surface of the concavity VAb. On the other hand, in the example of FIG. 7B, angle θa is greater than 90 degrees and thus, θb≥θa in the part of the side surface of the concavity VAb, closer to the surface 20A.

The width Wb1 of the concavity VAb in the first direction X in the surface 20B is greater than the width Wa1 of the hole VAa in the first direction X in the surface 20A. A depth Hb of the concavity VAb in the third direction (thickness direction) Z is greater than a length Ha of the hole VAa in the third direction Z. A depth Hb of the concavity VAb in the third direction Z is, for example, greater than a half of a thickness HG of the second basement 20.

With the display device DSP including the above sensor SS, the detection electrodes Rx provided with the second substrate SUB2 are connected to the pads P provided with the first substrate SUB1 by the connecting materials C in the contact holes V. Thus, a wiring substrate used for the connection between the detection electrodes Rx and the detection circuit RC is not necessary to be mounted on the second substrate SUB2. That is, the wiring substrate SUB3 mounted on the first substrate SUB1 forms a transmission line to transmit signals necessary for the image display of the display panel PNL and also a transmission line to transmit signals between the detection electrodes Rx and the detection circuit RC. That is, as compared to a case where an additional wiring substrate is required other than the wiring substrate SUB3, the number of the wiring substrates can be reduced, and production costs can be reduced. Furthermore, a space required to connect a wiring substrate to the second substrate SUB2 can be omitted, and thus, the non-display area of the display panel PNL, especially, the width of the end sides where the wiring substrate SUB3 is mounted can be reduced. Therefore, a thin bezel structure and production cost reduction can be achieved.

Furthermore, in the present embodiment, the detection electrode Rx and the connecting material C contact in the concavity VAb formed in the surface 20B of the second basement 20, and the upper end CT of the connecting material C is disposed below the surface 20B of the second basement 20. Furthermore, the contact hole V1 including the concavity VAb is filled with the filling material FM. That is, a step caused by the contact hole V1 is eased by the filling material FM. Thus, when the second optical element OD2 is attached, peeling of the second optical element OD2 caused by a step in the underlying layer of the second optical element OD2 can be suppressed.

Now, an example of a manufacturing method of the above display device DSP will be explained with reference to FIGS. 8A to 10C.

Figure 8A:
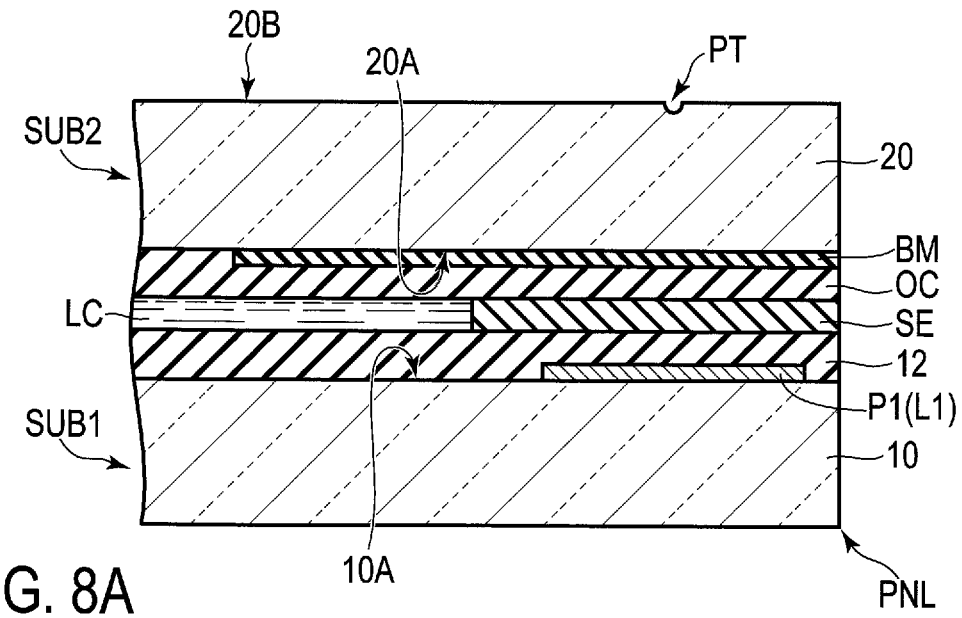
FIG. 8A is a schematic cross-sectional view showing a manufacturing process of the display device of the first embodiment.

Initially, a display panel PNL is prepared as in FIG. 8A. The display panel PNL includes a first substrate SUB1 including at least a first basement 10 and a first conductive layer L1 and a second substrate SUB2 including at least a second basement 20. While the second basement 20 is opposed to the first conductive layer L1 and the second basement 20 is apart from the first conductive layer L1, the first substrate SUB1 and the second substrate SUB2 are adhere by the sealant SE. In the example depicted, a liquid crystal layer LC is held between the first substrate SUB1 and the second substrate SUB2. Note that the first conductive layer L1 here corresponds to, for example, the pad P1 of FIG. 1, and the second conductive layer L2 here corresponds to, for example, the detection electrode Rx1 of FIG. 1.

An example of a manufacturing method of such a display panel PNL will be explained. The first substrate SUB1 including the first conductive layer L1 and the second insulating layer 12 formed on the surface 10A of the first basement 10 is prepared. On the other hand, the second substrate SUB2 including the light shielding layer BM and the overcoat layer OC formed on the surface 20A of the second basement 20 is prepared. Here, in either the first substrate SUB1 or the second substrate SUB2, a loop-like sealant SE is formed and a liquid crystal material is dropped on the area surrounded the sealant SE. Then, the first substrate SUB1 and the second substrate SUB2 are adhered together such that the surface 10A and the surface 20A are opposed to each other, and the sealant SE is cured to adhere the first substrate SUB1 and the second substrate SUB2. Through the above processes, the display panel PNL of FIG. 8A is produced.

Then, a concavity PT is formed in the surface 20B of the second basement 20. The concavity PT is formed in the area in which the pad P1 is provided. In the example depicted, the concavity PT overlaps the sealant SE.

Figure 8B:
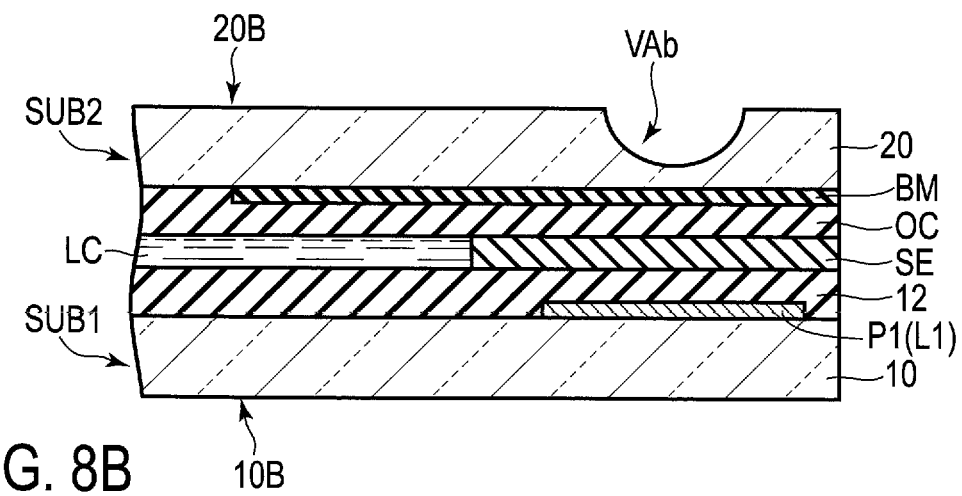
FIG. 8B is a schematic cross-sectional view showing a manufacturing process after FIG. 8A.

Then, as shown in FIG. 8B, the first basement 10 and the second basement 20 are each etched by an etching fluid such as hydrofluoric acid (HF) to thin the first basement 10 and the second basement 20. At that time, the concavity PT formed in the surface 20B is expanded and a concavity VAb is formed. Note that, if the etching process proceeds in an isotropic manner, the concavity VAb has substantially the same shape as the concavity PT. Note that, in the example of FIG. 8B, wet etching using a liquid etchant is performed; however, dry etching using a gaseous etchant may be performed instead.

Figure 8C:
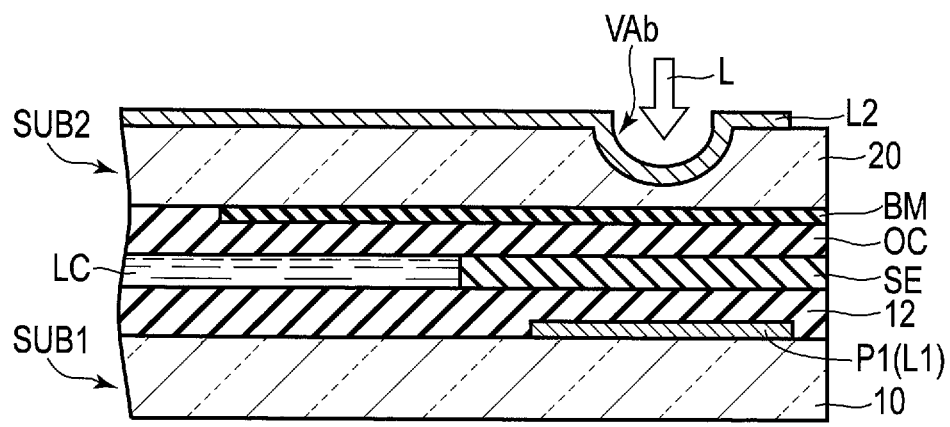
FIG. 8C is a schematic cross-sectional view showing a manufacturing process after FIG. 8B.

Then, as shown in FIG. 8C, the second conductive layer L2 is formed in the surface 20B of the second basement 20 through, for example, sputtering. The second conductive layer L2 is formed in the concavity VAb. Then, laser light L is irradiated onto the concavity VAb. In the example depicted, laser light L is irradiated from the upper side of the second conductive layer L2. As a laser source, a carbonic acid gas laser device or the like is applicable, or any device which can pierce through a glass material and an organic material such as an excimer laser device is applicable. In the example depicted, since laser light L is irradiated after the concavity VAb is preliminarily formed, laser light L is used less as compared to a case where a concavity VAb is not formed. Thus, glass residue and the like on the second basement 20 caused by the laser irradiation are reduced.

Figure 9A:
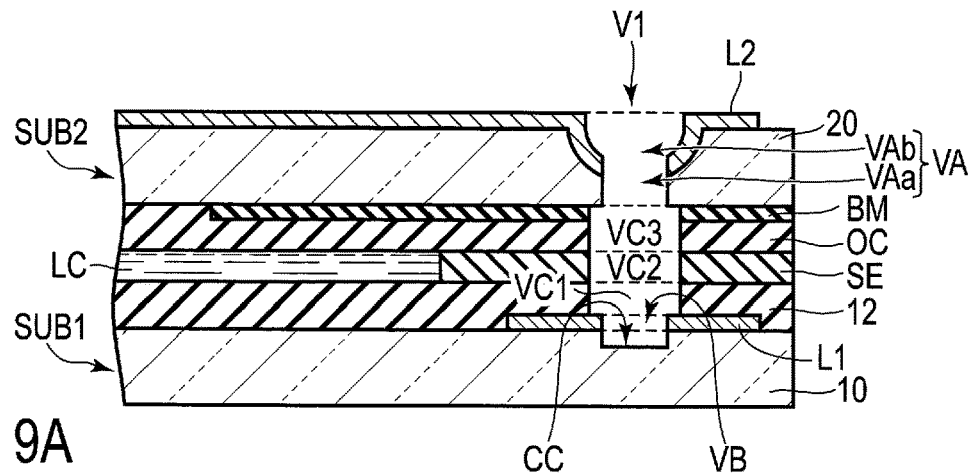
FIG. 9A is a schematic cross-sectional view showing a manufacturing process after FIG. 8C.

By irradiating laser light L as above, a hole VAa penetrating the second basement 20 is formed as shown in FIG. 9A. Thus, the hole VA including the concavity VAb and the hole VAa connected to the concavity VAb is formed. Furthermore, in the example depicted, a third part VC3 penetrating the light shielding layer BM and the overcoat layer OC immediately below the hole VA, second part VC2 penetrating the sealant SE immediately below the third part VC3, first part VC1 penetrating the second insulating layer 12 immediately below the second part VC2, hole VB penetrating the first conductive layer L1 immediately below the first part VC1, and concavity CC of the first basement 10 immediately below the hole VB are formed at the same time when laser light L is irradiated. Through the above, a contact hole V1 connecting the first conductive layer L1 and the second conductive layer L2 is formed. In the example depicted, the contact hole V1 penetrates the second conductive layer L2.

Figure 9B:
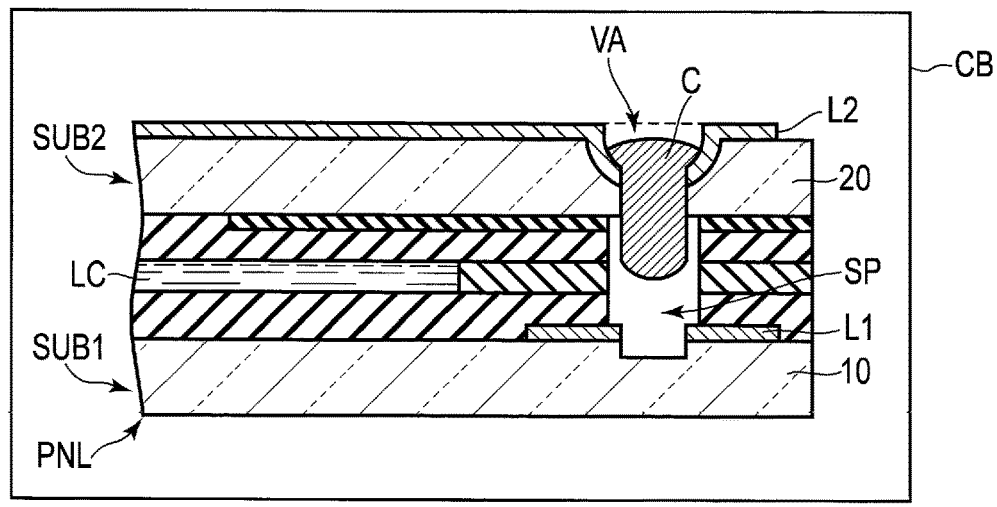
FIG. 9B is a schematic cross-sectional view showing a manufacturing process after FIG. 9A.

Then, as shown in FIG. 9B, after the display panel PNL is disposed in a chamber CB, air in the chamber CB is discharged, and the connecting material C is injected in the hole VA in vacuum (in an environment with pressure lower than the atmosphere). At that time, the connecting material C does not flow in the first conductive layer L1 and a space SP may be formed between the connecting material C and the first conductive layer L1. Note that the space SP is vacuum.

Figure 9C:
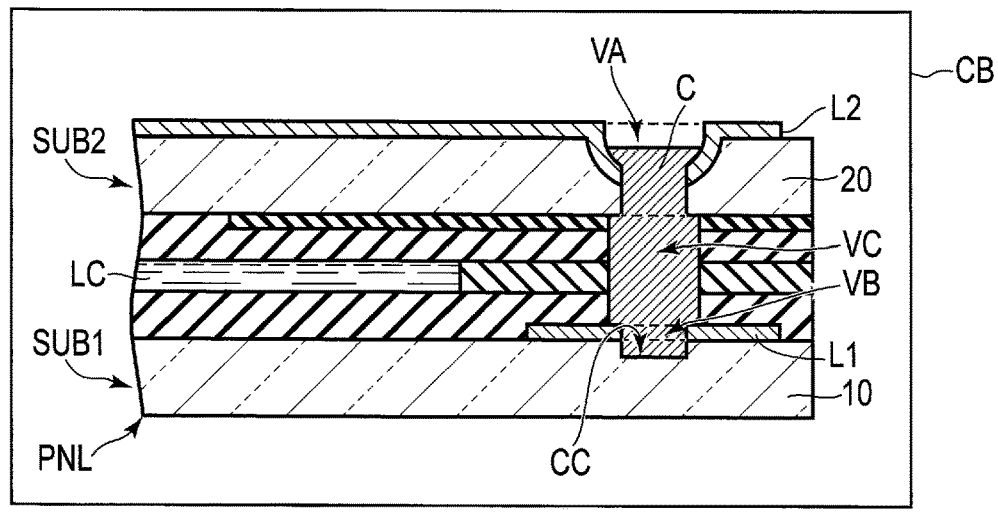
FIG. 9C is a schematic cross-sectional view showing a manufacturing process after FIG. 9B.

Then, as shown in FIG. 9C, air, inert gas, or the like is introduced in the chamber CB to decrease the degree of vacuum therein, and the connecting material C flows from the hole VA into the holes VC and VB, and concavity CC by a pressure difference between the space SP and the periphery of the display panel PNL, and the connecting material C contacts the first conductive layer L1.

Then, as shown in FIG. 10A, a solvent in the connecting material C is removed to reduce the volume of the connecting material C and a hollow part HL is formed. The connecting material C formed as above contacts the second conductive layer L2 and the second basement 20 in the hole VA, contacts the light shielding layer BM, overcoat layer OC, sealant SE, and second insulating layer 12 in the hole VC, contacts the first conductive layer L1 in the hole VB, and contacts the first basement 10 in the concavity CC. In the hole VA, the upper end CT of the connecting material C is disposed below the surface 20B of the second basement 20.

Note that the method of forming the connecting material C explained with reference to FIGS. 9B, 9C, and 10A is merely an example, and no limitation is intended thereby. For example, even if the connecting material C is injected in the hole VA in the atmosphere, and then the solvent in the connecting material C is removed, the same connecting material C can be formed.

Then, as shown in FIG. 10B, the filling material FM is filled in the hollow part HL of the connecting material C and the concavity VAb. Thus, a step in the third direction caused by the hollow part HL in the connecting material C and a step in the third direction Z caused by the concavity VAb can be eased.

Then, as shown in FIG. 10C, the second optical element OD is adhered to the surface 20B side of the second basement 20. In the example depicted, the second optical element OD2 extends in the part overlapping the contact hole V1, and as described above, since the step of the underlying layer of the second optical element OD2 is eased, peeling-off of the second optical element OD2 can be suppressed.

As can be understood from the above, the present embodiment can present a display device of a thin bezel structure and low production cost and a manufacturing method thereof.

Second Embodiment

Figure 11:
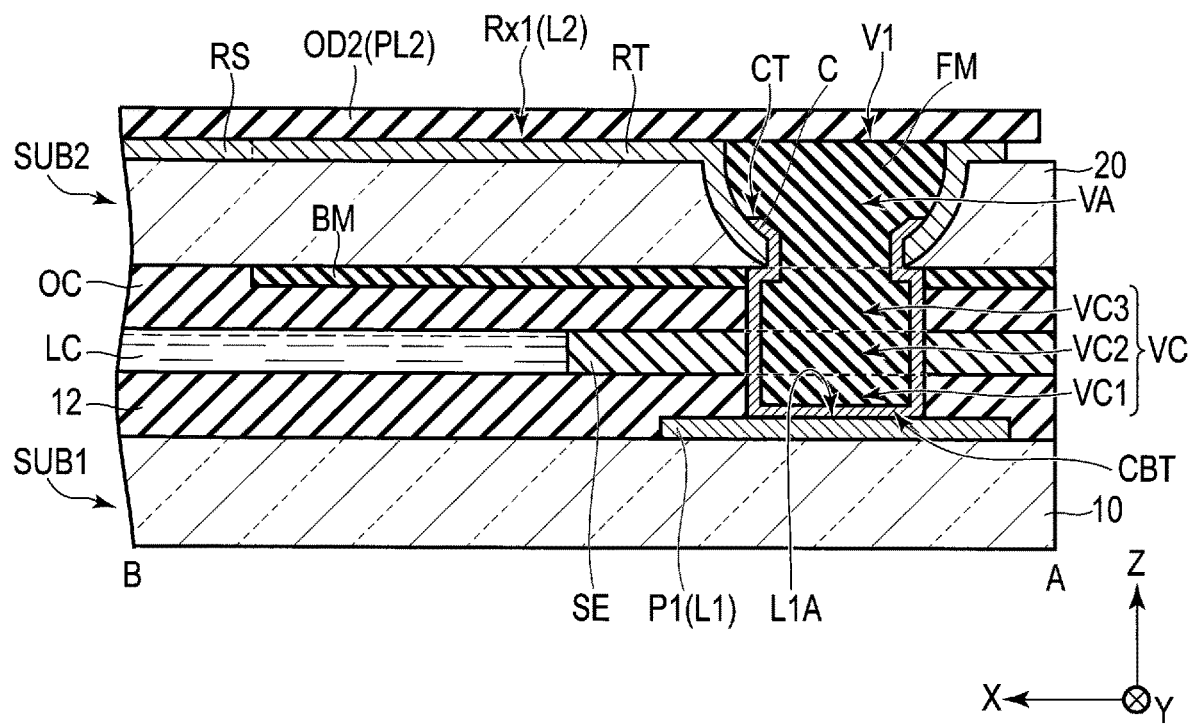
FIG. 11 is a schematic cross-sectional view of a non-display area of a display device of a second embodiment.

FIG. 11 is a cross-sectional view of a display device of a second embodiment including a contact hole. In the second embodiment, a hole VA of a contact hole V1 has a bowl-like shape, and in this respect, the second embodiment differs from the first embodiment.

The contact hole V1 includes a hole VA penetrating the second basement 20 and a hole VC penetrating various organic insulating layers. In the example depicted, the contact hole V1 penetrates a terminal RT of the detection electrode Rx. In the hole VA, the detection electrode Rx is interposed between the second basement 20 and a connecting material C. In the example depicted, the second basement 20 contacts the detection electrode Rx alone and is apart from the connecting material C. Furthermore, the contact hole V1 does not penetrate the first conductive layer L1. That is, a lower end (end in the first substrate SUB1 side) CBT of the connecting material C formed in the contact hole V1 contacts the first conductive layer L1 in the upper surface L1A side which is opposed to the second substrate SUB2. Note that, although this is not depicted, the contact hole V1 may include a hole penetrating the first conductive layer L1 and a concavity opposed to the hole VC formed in the first basement 10.

Figure 12:
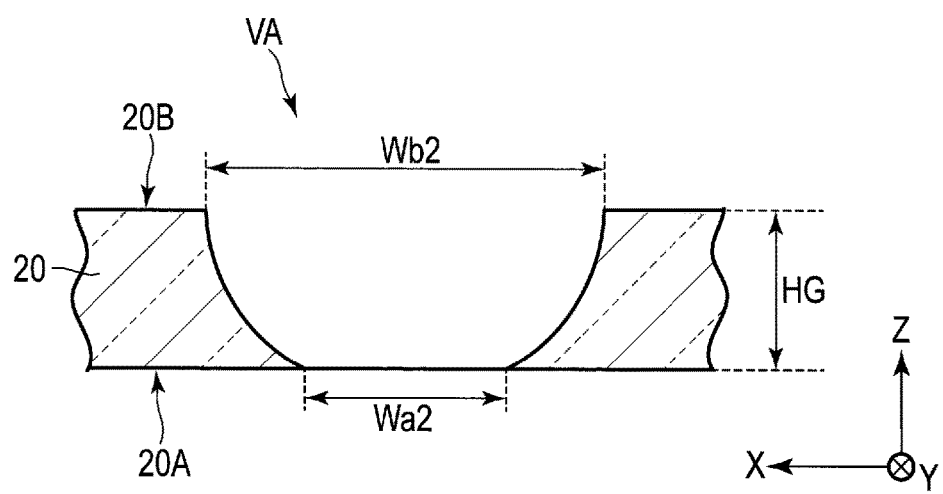
FIG. 12 shows a basement of FIG. 11 in an enlarged manner.

FIG. 12 shows the hole VA in an enlarged manner.

The hole VA has a bowl-like shape. That is, the side surface (inner surface) of the hole VA is curved. For example, the cross-section of the hole VA has a curve the center of a curvature of which comes in or above the hole VA. The cross-section of the hole VA may have a plurality of curves. An angle between a tangent of the side surface of the hole VA and a plane parallel to the X-Y plane is, for example, 90 degrees in the proximity of the surface 20B of the second basement 20 and gradually approaches 180 degrees while reaching the surface 20A.

A width Wb2 of the hole VA in the surface 20B along the first direction X is greater than a width Wa2 of the hole VA in the surface 20A along the first direction X. Furthermore, the width Wb2 is greater than a thickness HG of the second basement 20. The width Wb2 is, for example, twice or more the thickness HG of the second basement 20.

Now, an example of a manufacturing method of the above display device will be explained with reference to FIGS. 13A to 13C.

Initial processes of the manufacturing method of the present embodiment are the same as in those of the first embodiment until the process shown in FIG. 8, and thus, the description thereof will be omitted.

In the present embodiment, as shown in FIG. 13A, the concavity is expanded to penetrate the second basement 20 when the first basement 10 and the second basement 20 are thinned by etching and the hole VA is formed.

Then, as shown in FIG. 13B, a second conductive layer L2 is formed on the surface 20B of the second basement 20 through, for example, a sputtering method. The second conducive layer L2 is formed in the hole VA as well. Then, laser light L is irradiated on the area with the hole VA. In the example depicted, laser light L is irradiated from the upper side of the second conductive layer L2. At that time, the diameter of laser light L may be set greater than the diameter of laser light L in the first embodiment. Furthermore, the output of laser light L is adjusted to reduce the strength of laser light L as compared to the first embodiment.

Through the irradiation of laser light L, the contact hole V1 which does not penetrate the first conductive layer L1 is formed as in FIG. 13C. That is, a third part VC3 penetrating the light shielding layer BM and the overcoat layer OC immediately below the hole VA, second part VC2 penetrating the sealant SE immediately below the third part VC3, and first part VC1 penetrating the second insulating layer 12 immediately below the second part VC2 are formed at the same time when laser light L is irradiated. In the example depicted, the contact hole V1 penetrates the second conductive layer L2.

Thereafter, the same processes as in the first embodiment are performed, and thus, the description will be omitted.

In the present embodiment, the same advantages as in the first embodiment can be obtained. Furthermore, the lower end CBT of the connecting material C contacts the upper surface L1A of the first conductive layer L1, and thus, the area of contact of the connecting material C and the first conductive layer L1 can be increased as compared to the first embodiment. Thus, good electric characteristics can be obtained.

Note that, in the above description, each of the concavity VAb in the first embodiment and the hole VA in the second embodiment is a circle in a plan view; however, the shape thereof may be changed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Some examples of the electronic device achieved from the structure described in the present application will be noted as follows.

(1) An electronic device comprising:
a first substrate including a first basement and a first conductive layer;
a second substrate including:
a second basement which is disposed to be apart from the first conductive layer and includes a first surface opposed to the first conductive layer and a second surface opposite to the first surface,
a second conductive layer disposed on the second surface,
a first hole penetrating the second basement; and
a connecting material electrically connecting the first conductive layer and the second conductive layer via the first hole, wherein
the first hole is shaped as a funnel.

(2) The electronic device according to (1), wherein the first hole includes a bowl-like first concavity disposed in the second surface side and a tube-like second hole connected to the first concavity.

(3) The electronic device according to (2), wherein the first concavity has a depth which is greater than a length of the second hole along a thickness direction of the second basement.

(4) The electronic device according to (1), wherein the second conductive layer is disposed in the first hole, and the connecting material contacts the second conductive layer in the first hole.

(5) The electronic device according to (1), wherein an end of the connecting material in the first hole is arranged closer to a first surface side than is the second surface.

(6) The electronic device according to (1), wherein the second basement contacts the second conductive layer and the connecting material in the first hole.

(7) The electronic device according to (1), wherein the first conductive layer includes a third hole opposed to the first hole.

(8) The electronic device according to (7), wherein a width of the third hole is less than a width of the first concavity along the second surface.

(9) The electronic device according to (1), wherein the first basement includes a second concavity opposed to the first hole.

(10) The electronic device according to (9), wherein a width of the second concavity is less than a width of the first concavity along the second surface.

(11) An electronic device comprising:
a first substrate including a first basement and a first conductive layer;
a second substrate including:
a second basement which is disposed to be apart from the first conductive layer and includes a first surface opposed to the first conductive layer and a second surface opposite to the first surface,
a second conductive layer disposed on the second surface,
a first hole penetrating the second basement; and
a connecting material electrically connecting the first conductive layer and the second conductive layer via the first hole, wherein
the first hole is formed in a bowl-like shape, and
a width of the first hole along the second surface is greater than a width of the first hole along the first surface.

(12) The electronic device according to (11), wherein the width of the first hole along the second surface is greater than a thickness of the second basement.

(13) The electronic device according to (11), wherein the second conducive layer is disposed in the first hole, and
the connecting material contacts the second conducive layer in the first hole.

(14) The electronic device according to (11), wherein an end of the connecting material in the first hole is closer to a first surface side than is the second surface.

(15) The electronic device according to (11), wherein the second conductive layer is interposed between the second basement and the connecting material in the first hole.

(16) The electronic device according to (11), wherein the connecting material contacts an upper surface of the first conductive layer.

(17) A manufacturing method of an electronic device, comprising:
preparing a first substrate including a first basement and a first conductive layer and a second substrate including a second basement which is apart from the first conductive layer;
forming a concavity in the second basement at a second surface which is opposite to a first surface which is opposed to the first substrate;
etching the first basement and the second basement to decrease the thickness thereof and to expand the concavity;
forming a second conductive layer on the second surface of the second basement and inside the concavity;
irradiating an area where the concavity is formed with a laser light to form a hole penetrating at least the second conductive layer in the concavity and the second basement; and forming a connecting material electrically connecting the first conductive layer and the second conductive layer via the hole.

(18) The manufacturing method according to (17), wherein a second concavity is formed in the first basement to be opposed to the hole during the irradiating with the laser light.

(19) The manufacturing method according to (17), wherein the concavity is expanded to penetrate the second basement by the etching.

(20) The manufacturing method according to (17), wherein an end of the connecting material in a second substrate side is closer to a first substrate side than is the second surface in the second basement.

What is claimed is:
1. An electronic device comprising:
a first substrate including a first glass substrate and a first conductive layer;
a second substrate including:
a second glass substrate which is disposed to be apart from the first conductive layer and includes a first surface opposed to the first conductive layer and a second surface opposite to the first surface,
a second conductive layer disposed on the second surface, and
a first hole penetrating the second glass substrate; and
a connecting material electrically connecting the first conductive layer and the second conductive layer via the first hole, wherein
the first hole is shaped as a funnel, and
the connecting material includes a hollow part in which an insulative filling material is filled.

2. The electronic device according to claim 1, wherein the first hole includes a bowl-like first concavity disposed in the a second surface side and a tube-like second hole connected to the bowl-like first concavity.

3. The electronic device according to claim 2, wherein the bowl-like first concavity has a depth which is greater than a length of the tube-like second hole along a thickness direction of the second glass substrate.

4. The electronic device according to claim 2, wherein the first conductive layer includes a third hole opposed to the first hole.

5. The electronic device according to claim 4, wherein a width of the third hole is less than a width of the bowl-like first concavity along the second surface.

6. The electronic device according to claim 2, wherein the first glass substrate includes a second concavity opposed to the first hole.

7. The electronic device according to claim 6, wherein a width of the second concavity is less than a width of the bowl-like first concavity along the second surface.

8. The electronic device according to claim 1, wherein the second conductive layer is disposed in the first hole, and
the connecting material contacts the second conductive layer in the first hole.

9. The electronic device according to claim 1, wherein an end of the connecting material in the first hole is arranged between the first surface and the second surface along a thickness direction of the second glass substrate.

10. The electronic device according to claim 1, wherein the second glass substrate contacts the second conductive layer and the connecting material in the first hole.

11. The electronic device according to claim 1, further comprising an optical element overlapping the second substrate, wherein the optical element overlaps the second conductive layer and the first hole.

12. The electronic device according to claim 1, further comprising
a sealant bonding the first substrate and the second substrate;
a first organic insulating layer between the first conductive layer and the sealant; and
a second organic insulating layer between the sealant and the second glass substrate, wherein
a first part penetrating the first organic insulating layer, a second part penetrating the sealant, and a third part penetrating the second organic insulating layer are arranged in a thickness direction of the electric device in this order,
the first hole is connected to the third part, and
the connecting material contacts the first conductive layer and the first organic insulating layer in the first part, contacts the sealant in the second part, and contacts the second organic insulating layer in the third part.

13. An electronic device comprising:
a first substrate including a first glass substrate and a first conductive layer;
a second substrate including:
a second glass substrate which is disposed to be apart from the first conductive layer and includes a first surface opposed to the first conductive layer and a second surface opposite to the first surface,
a second conductive layer disposed on the second surface, and
a first hole penetrating the second glass substrate; and
a connecting material electrically connecting the first conductive layer and the second conductive layer via the first hole, wherein
the first hole is formed in a bowl-like shape,
a width of the first hole along the second surface is greater than a width of the first hole along the first surface, and
the connecting material includes a hollow part in which an insulative filling material is filled.

14. The electronic device according to claim 13, wherein the width of the first hole along the second surface is greater than a thickness of the second glass substrate.

15. The electronic device according to claim 13, wherein the second conductive layer is disposed in the first hole, and
the connecting material contacts the second conductive layer in the first hole.

16. The electronic device according to claim 13, wherein an end of the connecting material in the first hole is between the first surface and the second surface along a thickness direction of the second glass substrate.

17. The electronic device according to claim 13, wherein the second conductive layer is interposed between the second glass substrate and the connecting material in the first hole.

18. The electronic device according to claim 13, wherein the connecting material contacts an upper surface of the first conductive layer.

19. The electronic device according to claim 13, further comprising an optical element overlapping the second substrate, wherein
the optical element overlaps the second conductive layer and the first hole.

20. The electronic device according to claim 13, further comprising
a sealant bonding the first substrate and the second substrate;
a first organic insulating layer between the first conductive layer and the sealant; and
a second organic insulating layer between the sealant and the second glass substrate, wherein
a first part penetrating the first organic insulating layer, a second part penetrating the sealant, and a third part penetrating the second organic insulating layer are arranged in a thickness direction of the electric device in this order,
the first hole is connected to the third part, and
the connecting material contacts the first conductive layer and the first organic insulating layer in the first part, contacts the sealant in the second part, and contacts the second organic insulating layer in the third part.

* * * * *